US011392180B1

(12) United States Patent
Yates et al.

(10) Patent No.: US 11,392,180 B1
(45) Date of Patent: Jul. 19, 2022

(54) FLEXIBLE BACKSIDE COVERINGS AND METHODS FOR HINGED INFORMATION HANDLING SYSTEMS

(71) Applicant: DELL PRODUCTS L.P., Round Rock, TX (US)

(72) Inventors: Brian J. Yates, Cedar Park, TX (US); Nicholas Abbatiello, Round Rock, TX (US); Weijong Sheu, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/150,743

(22) Filed: Jan. 15, 2021

(51) Int. Cl.
G06F 1/16 (2006.01)
H05K 5/03 (2006.01)
H05K 5/02 (2006.01)

(52) U.S. Cl.
CPC .......... G06F 1/1681 (2013.01); G06F 1/1616 (2013.01); H05K 5/0226 (2013.01); H05K 5/03 (2013.01)

(58) Field of Classification Search
CPC .... G06F 1/1616; G06F 1/1681; H05K 5/0226
See application file for complete search history.

(56) References Cited

U.S. PATENT DOCUMENTS

| 2016/0014914 A1* | 1/2016 | Stroetmann .......... H05K 5/0021 312/223.1 |
| 2018/0049336 A1* | 2/2018 | Manuel .................... E05D 7/00 |
| 2018/0095502 A1* | 4/2018 | Yamazaki .............. F16M 11/38 |

OTHER PUBLICATIONS

Pelissier et al., "Systems And Methods For Resolving Touch And Pen Conflicts Between Multiple Touch Controllers Coupled To A Common Touchscreen Display", U.S. Appl. No. 17/150,423, filed Jan. 15, 2021, DELL:305, 48 pgs.

\* cited by examiner

*Primary Examiner* — Anthony Q Edwards
(74) *Attorney, Agent, or Firm* — Egan, Enders & Huston LLP.

(57) ABSTRACT

Disclosed herein are apparatus and methods that may be implemented to provide gapless flexible backside coverings for foldable information handling systems. The disclosed apparatus and materials may be configured in one embodiment to provide an integrated and flexible backside covering that is continuous across at least the backside hinge area of a foldable computer device, and that allows the foldable computer device to open and close (or unfold and fold) without the presence of any gaps in the covering.

20 Claims, 13 Drawing Sheets

(Contracted)

(Contracted)

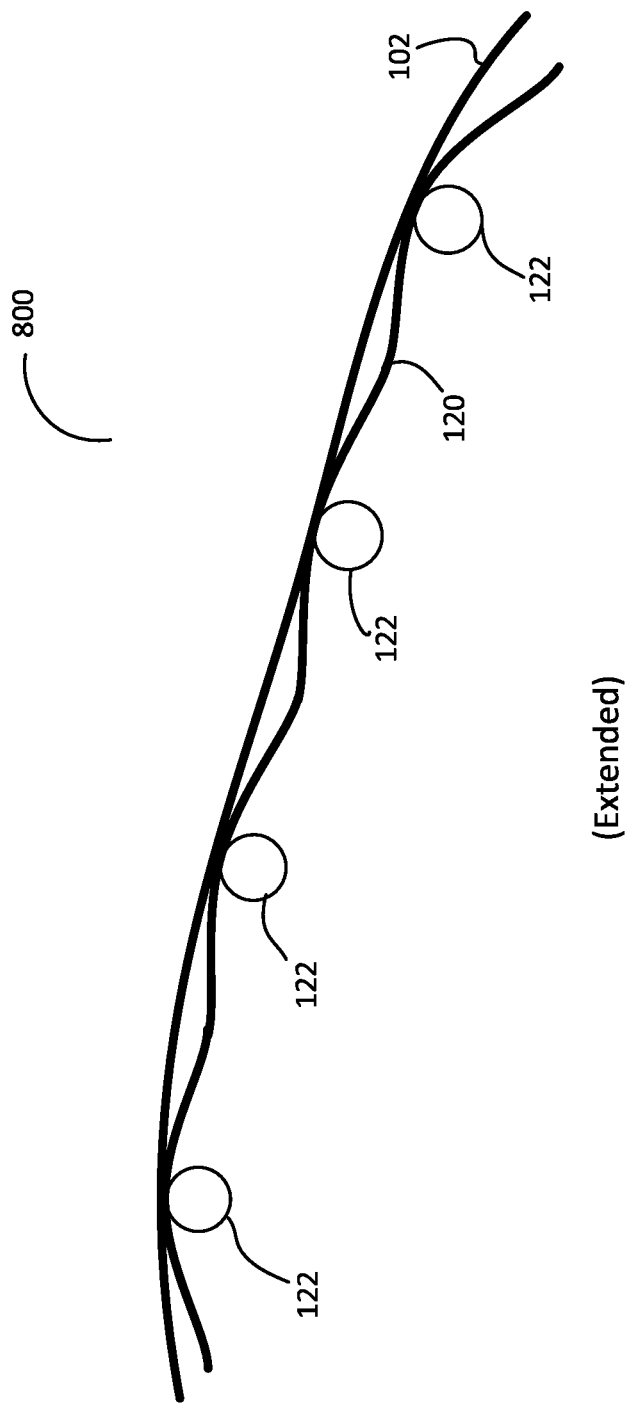
FIG. 9 (Extended)

FLEXIBLE BACKSIDE COVERINGS AND METHODS FOR HINGED INFORMATION HANDLING SYSTEMS

FIELD

This invention relates generally to information handling systems and, more particularly, to coverings for hinged computer devices.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include portable foldable computer devices that have a foldable unitary continuous touchscreen display. Separate top and bottom sections of a conventional foldable computer device support the backside of the unitary touchscreen display and fold together about a mechanical hinge that lies beneath the continuous foldable touchscreen display. Solid inflexible and non-foldable covers are provided on the backside of the top and bottom sections of the foldable computer device so that the foldable computer device looks like a conventional laptop when it is folded closed. More specifically, the hinge area of a conventional foldable computer device is at most only partially overlapped on the backside by the inflexible solid material of the non-foldable covers when the device is in a folded condition. This inflexible solid material is typically bulky, and a gap must be provided along the hinge area between the inflexible solid material covers in order to provide sufficient mechanical clearance to allow opening (or unfolding) of the device without incurring mechanical interference between the sections of the solid inflexible material. This gap is not aesthetically pleasing, and creates an undesirable open space along the hinge area into which foreign objects (such as dirt, a user's finger or user's clothes, etc.) may intrude and/or be pinched.

SUMMARY

Disclosed herein are gapless flexible backside coverings for foldable information handling systems, such as a foldable computer device having a unitary continuous frontside display (e.g., touchscreen display or non-touch display-only screen) that is foldable about itself. It is also possible that the disclosed gapless flexible backside coverings may also be employed for hinged information handling systems having two or more separate frontside display screens that are hinged together with a gap existing between adjacent frontside display screens, and/or for hinged information handling systems having a single frontside display screen that is provided on only one hinged half section of the system with a physical keyboard and touchpad provided on the other hinged half section.

The disclosed apparatus and materials may be configured in one embodiment to provide an integrated, flexible, and low-profile (i.e., minimum stack height) backside covering that is continuous across at least a hinge area (e.g., along and to either side of an axis of rotation or longitudinal axis of a hinge mechanism) of a foldable computer device, and that allows the foldable computer device to open and close (or unfold and fold) without the presence of any gaps in the covering. In a further embodiment, the continuous and flexible backside covering may be configured to maintain a relatively smooth, clean, and/or gapless backside outer surface across a foldable hinge area of a foldable information handling system when it is disposed in both its folded and unfolded conditions, and as the device transitions in positions anywhere between the folded and unfolded conditions. In yet another embodiment, the continuous and flexible backside covering may be configured of materials and structure that maintains its functionality over multiple fold and unfold cycles, and in one embodiment for the lifetime of the device.

In one embodiment, a gapless backside outer surface may be provided across (and covering) a hinge area of a foldable information handling system. In one embodiment, the backside material that extends across the hinge area may be configured with accordion-style folds or pleats to create alternating outward-facing peaks and inward-facing valleys that run parallel to the hinge area of the foldable information handling system. In this configuration, the alternating peaks and valleys of the backside surface present a gapless backside surface over the hinge areas when the backside outer surface is contracted or compressed, e.g., such as when the foldable system is fully unfolded and opened 180 degrees to present the user with a continuous flat and planar frontside touchscreen surface. In this open unfolded position, the valleys serve to take up (or absorb) the "slack" of excess backside material that is contracted across the hinge area when the system is fully opened. When the system is then folded closed to 0 degrees about the hinge area, the excess backside material of the valleys is free to extend outward from the valleys across the hinge area without binding or tearing. This pleated peak and valley configuration allows the backside outer surface to maintain a gapless backside surface across the hinge area in all positions between the 0 degrees and 180 degrees orientations without "bulging" when the system is in the 180 orientation.

In one embodiment, the gapless backside outer surface may be optionally provided as a combination of multiple stacked material layers that extend across the hinge area of a foldable information handling. The combination of multiple layers may be selected to provide a strengthened and more rigid backside surface across the hinge area, and/or to reduce or prevent sagging of the backside surface into any open area/s between the backside surface and the hinge mechanism. In one exemplary embodiment, such a multiple-layer gapless backside surface configuration may include a combination of a pleated elastic support material (e.g., thermoplastic elastomer "TPE" such as thermoplastic polyurethane "TPU") that is overlain by a flexible gapless outer backside material (e.g., an elastic fabric such as a type of elastic polyurethane material like "elastane" which has elastic properties). In such an embodiment, the pleated elastic support material layer may be configured to provide a "support" or rigid structure to which the flexible gapless backside material layer is bonded, and to prevent "sagging" of the flexible gapless backside material that might otherwise telegraph the hinge mechanism to the exposed backside cosmetic surface of the information handling system. When the pleated elastic support material is configured as alternating peaks and valleys, the gapless outer backside material may only be bonded to the pleated elastic support material at the top of the peaks, and not bonded to the pleated elastic support material in the valley areas of the pleated elastic support material.

In a further embodiment, a separate structural rod or wire may be overmolded into the pleated elastic support material at each of the peak locations to contribute to the overall structure of the backside covering. In such an embodiment, the structural rods or wires may be positioned at the peak locations to provide additional rigidity that prevents telegraphing of the hinge mechanism to the outer surface of the covering.

In one respect, disclosed herein is an information handling system, including: a first section and a second section coupled together at their edges by a hinge, an open space being defined over a backside hinge area defined between a backside of the first section and a backside of the second section; a pleated first material disposed across the open space to extend between the backside of the first section and the backside of the second section, the pleated first material including multiple individual pleats; and at least one display screen coupled to at least one of a frontside of the first section or a frontside of the second section. The open space over the backside hinge area expands and individual pleats of the pleated first material extend apart from each other to fill the expanded open space over the backside hinge area when the first section and second section are folded together in a closed position, and the open space over the backside hinge area contracts and the individual pleats of the pleated first material contract together to fill the contracted open space over the backside hinge area when the first section and second section are unfolded apart from each other to an open position.

In another respect, disclosed herein is a method, including: rotating a first section of an information handling system relative to a second section of an information handling system about a hinge. An open space is defined over a backside hinge area defined between a backside of the first section and a backside of the second section. A pleated first material is disposed across the open space to extend between the backside of the first section and the backside of the second section, the pleated first material including multiple individual pleats. At least one display screen is coupled to at least one of a frontside of the first section or a frontside of the second section. In the method, rotating the first section of the information handling system relative to the second section of the information handling system further includes: folding the first section and second section together into a closed position to cause the open space over the backside hinge area expand and the individual pleats of the pleated first material to extend apart from each other to fill the expanded open space over the backside hinge area, and unfolding the first section and the section apart from each other into an open position to cause the open space over the backside hinge area to contract and the individual pleats of the pleated first material to contract together to fill the contracted open space over the backside hinge area.

In another respect, disclosed herein is a method, including: forming a pleated first material including multiple individual pleats; and assembling the pleated first material to a first section and a second section of an information handling system, the first and second sections being coupled together at their edges by a hinge with an open space being defined over a backside hinge area defined between a backside of the first section and a backside of the second section, and the pleated first material being assembled across the open space to extend between the backside of the first section and the backside of the second section.

BRIEF DESCRIPTION OF THE DRAWINGS

FIG. 9 illustrates an extended partial section of backside covering according to one exemplary embodiment of the disclosed apparatus and methods.

DESCRIPTION OF ILLUSTRATIVE EMBODIMENTS

Figure 1:
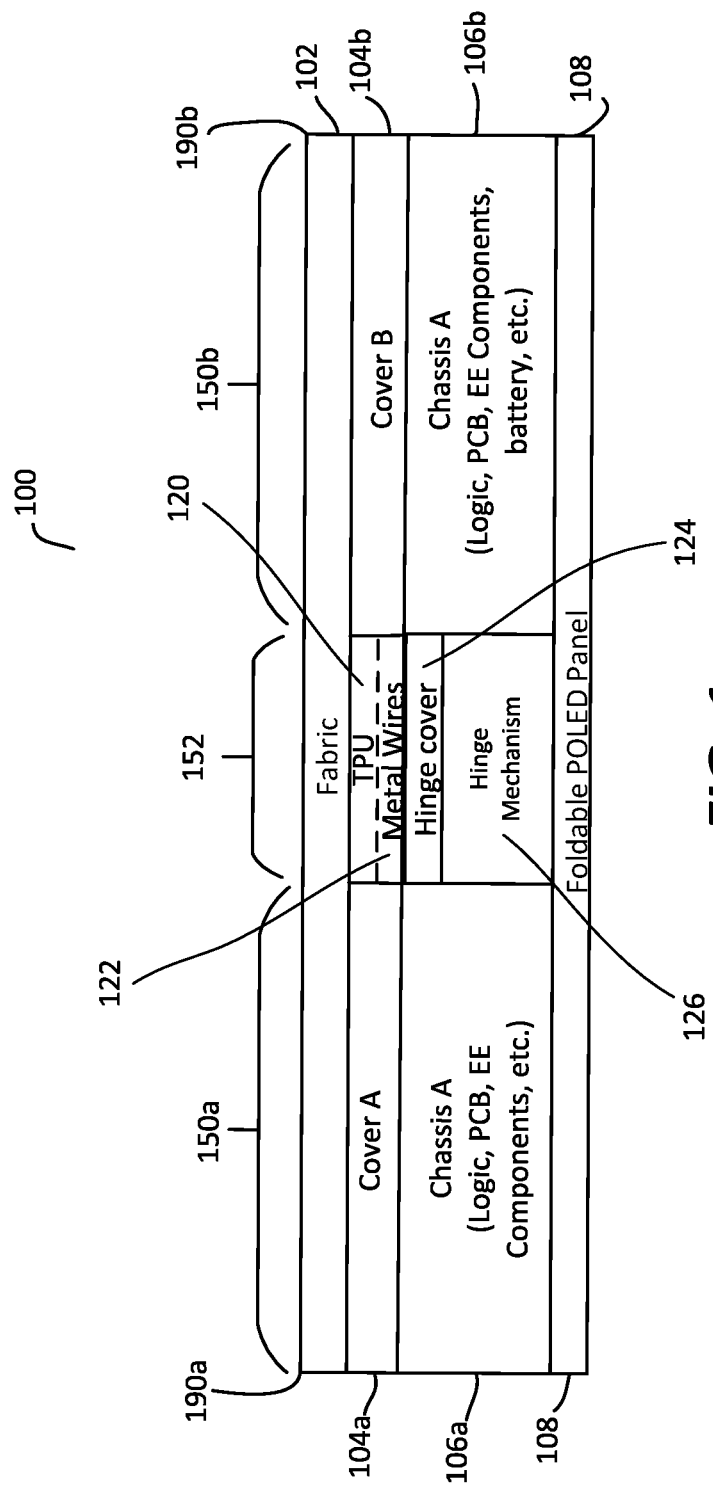
FIG. 1 illustrates a side cross section view of a foldable information handling system according to one exemplary embodiment of the disclosed apparatus and methods.
Figure 2:
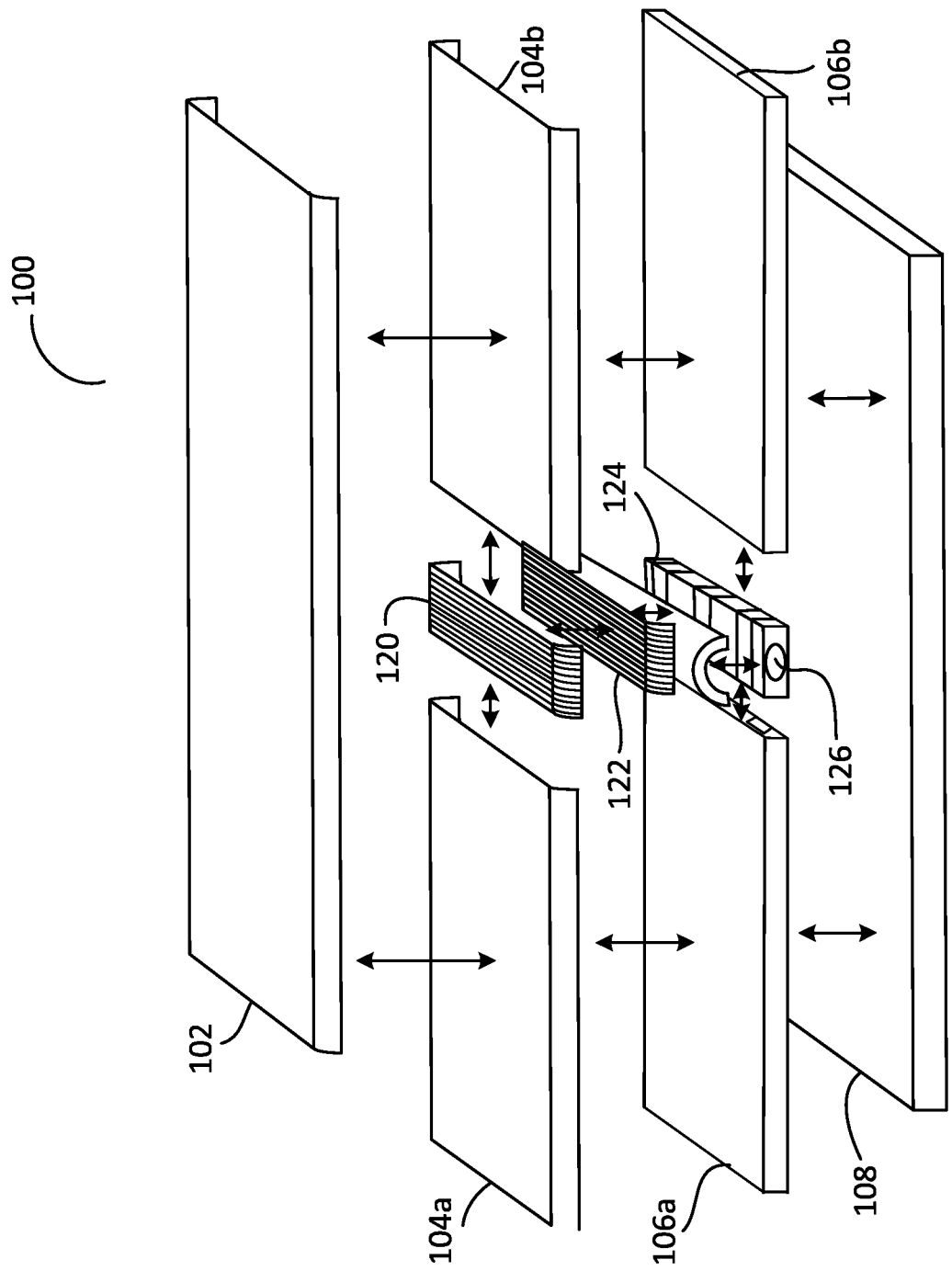
FIG. 2 illustrates an exploded side perspective view of the exemplary information handling system embodiment of FIG. 1.

FIG. 1 illustrates a side cross section view of one exemplary embodiment of a foldable information handling system 100 disclosed herein in an unfolded open position, with the respective free ends 190a and 190b of first and second separate sections 150a and 150b unfolded outward by 180 degrees from each other about a hinge area 152 that is operatively enabled by a mechanical hinge 126 (e.g., such as a butt hinge, etc.). FIG. 2 illustrates an exploded side perspective view of the exemplary information handling system embodiment 100 of FIG. 1. For purposes of illustration, FIGS. 1 and 2 show foldable system 100 with its gapless backside outer surface (i.e., having no gaps or openings in the backside surface) facing upward on the page and its frontside surface (with unitary continuous foldable touchscreen 108) facing downward on the page.

As shown in FIGS. 1 and 2, the frontside of the foldable system 100 includes a unitary and continuous planar touchscreen display 108 such as a flexible plastic organic light emitting diode (POLED) touchscreen display panel. Although described in relation to a frontside touchscreen 108, it will be understood that the disclosed systems and methods may also be implemented in similar manner for a non-touch sensitive and display-only flexible frontside display screen. Moreover, it is also possible that that the disclosed gapless flexible backside coverings may also be employed for foldable information handling systems having two or more separate frontside display screens that are hinged together with a gap existing between the adjacent frontside display screens, or for a notebook computer having a single display screen on a first section that is hinged together to a second section having a keyboard base, with a gap between the first and second sections.

In the embodiment of FIGS. 1 and 2, touchscreen display 108 is attached to (and supported by) a first chassis section "A" (106a) and a second chassis section "B" (106b) that are hingeably coupled together by mechanical hinge 126 along hinge area 152 as shown. Chassis sections 106a and 106b may each be chassis enclosures (e.g., formed of thin plastic or sheet metal) that contain electronic circuitry components that perform computing and networking tasks, drive display of images on touchscreen display 108, etc. Examples of such components include, but are not limited to, EE components, logic and printed circuit boards (PCBs) such as a central processing unit (CPU), a graphics processing unit (GPU), other programmable integrated circuits such as embedded controller (EC), PCBs, voltage regulation and battery, network interface controller (NIC), etc. Further information on electronic components and operation of a foldable information handling system may be found in U.S. patent application Ser. No. 17/150,423 by Gerald R. Pelissier et al. and filed on Jan. 15, 2021, which is incorporated herein by reference in its entirety for all purposes.

Still referring to FIGS. 1 and 2, a first chassis cover 104a is attached to cover the backside of chassis section 106a and a second chassis cover 104b is attached to cover the backside of chassis section 106b. A hinge cover 124 may be provided as shown to cover the mechanical hinge mechanism 126. Each of covers 104a, 104b and 124 may be constructed of, for example, hard plastic or sheet metal. As shown in FIG. 1, a hinge area 152 is defined between first chassis section 106a with its cover 104a and second chassis section 106b with its cover 104b. Within the hinge area 152, a hinge cover 124 may be attached to (or otherwise fixedly positioned relative to) the backside of hinge mechanism 126 as shown.

As shown in FIG. 1, an open space exists within the hinge area 152 over the hinge cover 124 and between covers 104a and 104b. In the embodiment of FIG. 1, a pleated elastic support material (e.g., TPE) 120 and optional parallel structural wires or rods 122 (e.g., metal wires or rods made of aluminum or steel, plastic or fiberglass wires, etc.) may be placed together over hinge cover 124 in order to fill this open space and prevent the overlying gapless backside outer material 102 and/or pleated elastic support material 120 from sagging into the open area over hinge cover 124. In this embodiment, the outer backside material 102 is a gapless outer backside material that extends continuously across the entire backside of foldable information handling system 100 (i.e., from free end 190a to 190b) with the outer backside material 102 fixedly attached (e.g., by adhesive such as epoxy) to the backside surface of each of first and second separate sections 150a and 150b. FIG. 2 shows the relationship between pleated elastic support material (e.g., TPE) 120 and structural rods or wires 122 in further detail. FIGS. 8 and 9 further illustrate the assembled relationship between gapless outer backside material 102, pleated elastic support material 120 and structural rods or wires 122, which is described and illustrated further in relation to these figures. It will be understood that in some embodiments, the gapless backside outer material 102 may be omitted, with the pleated elastic support material 120 being the outermost backside layer of the information handling system that is present at the hinge area 152.

Figure 3:
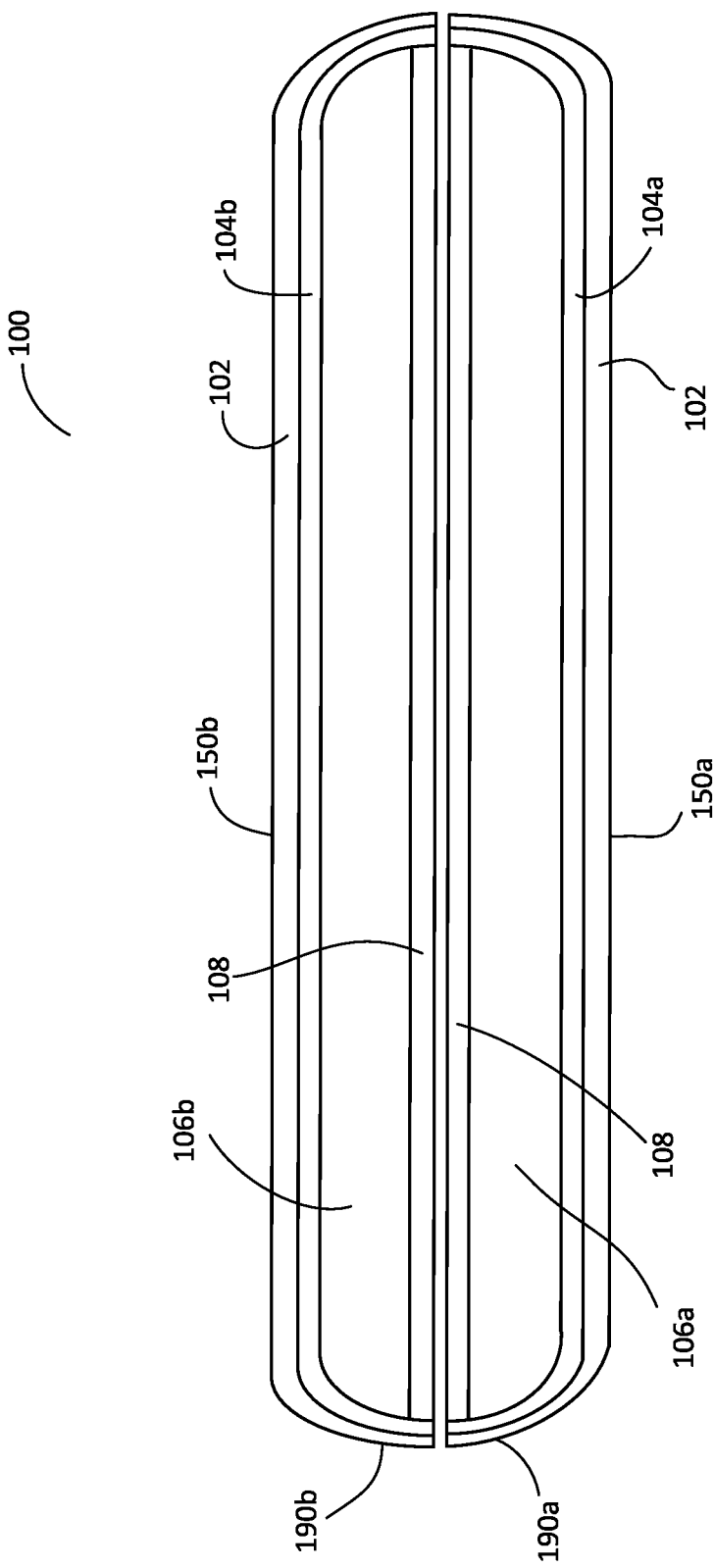
FIG. 3 illustrates an end view of the exemplary foldable information handling system embodiment of FIGS. 1 and 2, shown in a folded closed position according to one exemplary embodiment of the disclosed apparatus and methods.
Figure 4:
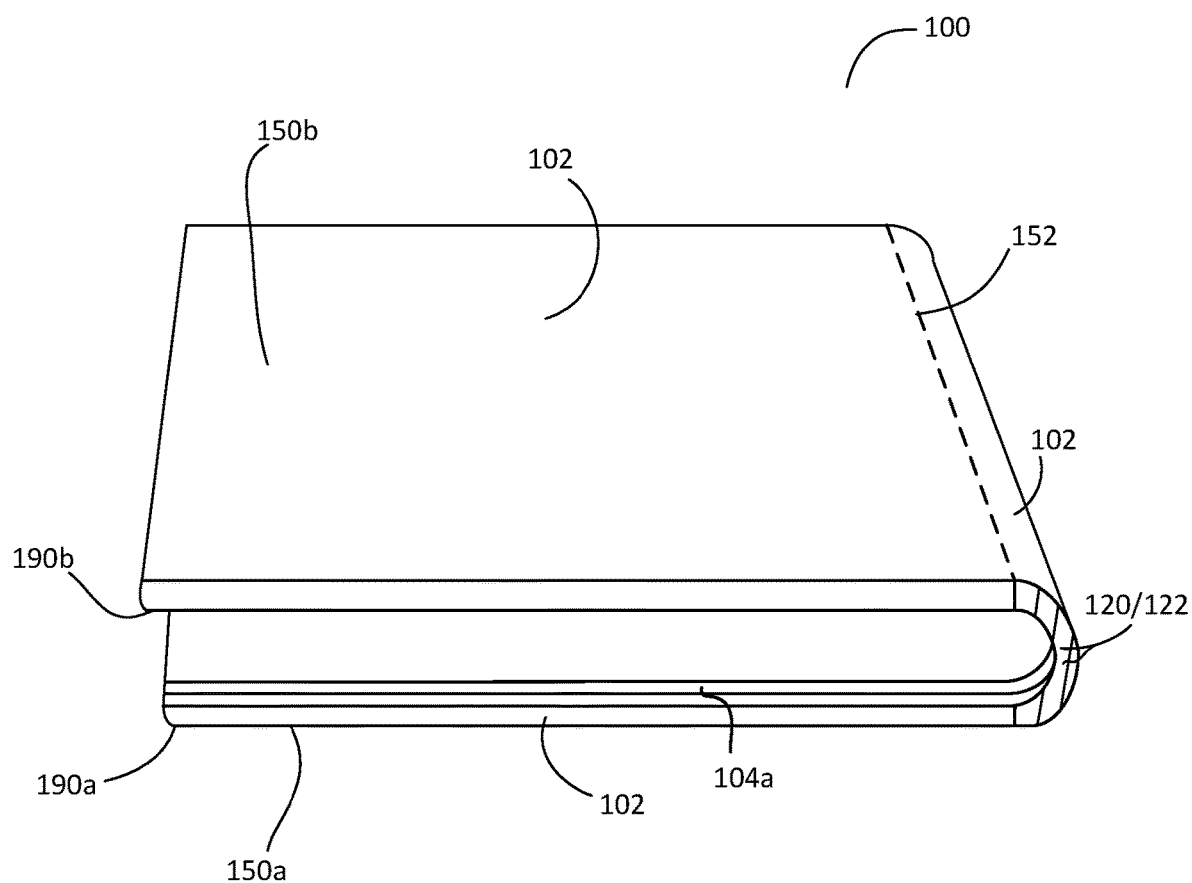
FIG. 4 illustrates an overhead perspective view of the exemplary folded-closed information handling system embodiment of FIG. 3.

FIG. 3 illustrates an end view of the exemplary embodiment of FIGS. 1 and 2, with foldable information handling system 100 in a folded closed position. The end view of FIG. 3 is taken from the direction of the free ends 190a and 190b as shown. FIG. 4 illustrates an overhead perspective view of the exemplary embodiment of the folded-closed information handling system 100 of FIG. 3, with the separate sections 150a and 150b folded together with each other in approximate parallel relationship, e.g., 0 degrees (or about 0 degrees) in relation to each other.

Figure 5:
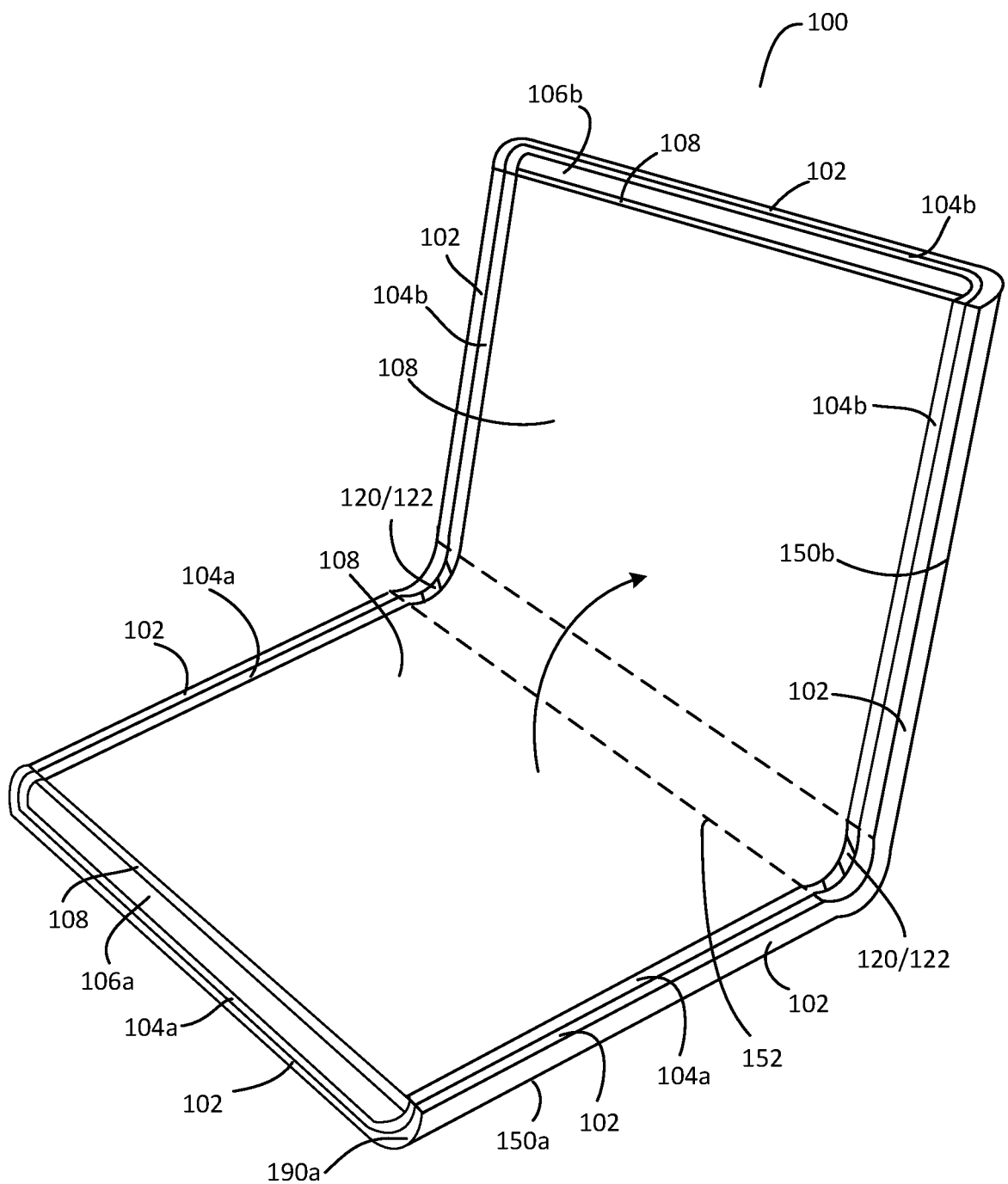
FIG. 5 illustrates a side perspective view of the exemplary information handling system embodiment of FIGS. 1 and 2.

FIG. 5 illustrates a side perspective view of the exemplary embodiment of foldable information handling system 100 of FIGS. 1 and 2 in a partially unfolded and open position with the separate sections 150a and 150b unfolded in the direction of the arrow about 100 degrees from each other, e.g., such as when system 100 is used in a notebook computer mode to allow typing on a keyboard displayed on the bottom half portion of the touchscreen display 108 with a typing window displayed in the top half portion of the display screen 108. As shown in FIG. 5, the continuous touchscreen display 108 is partially unfolded about the underlying hinge area 152, which is shown by dashed hidden lines in FIG. 5.

Figure 6A:
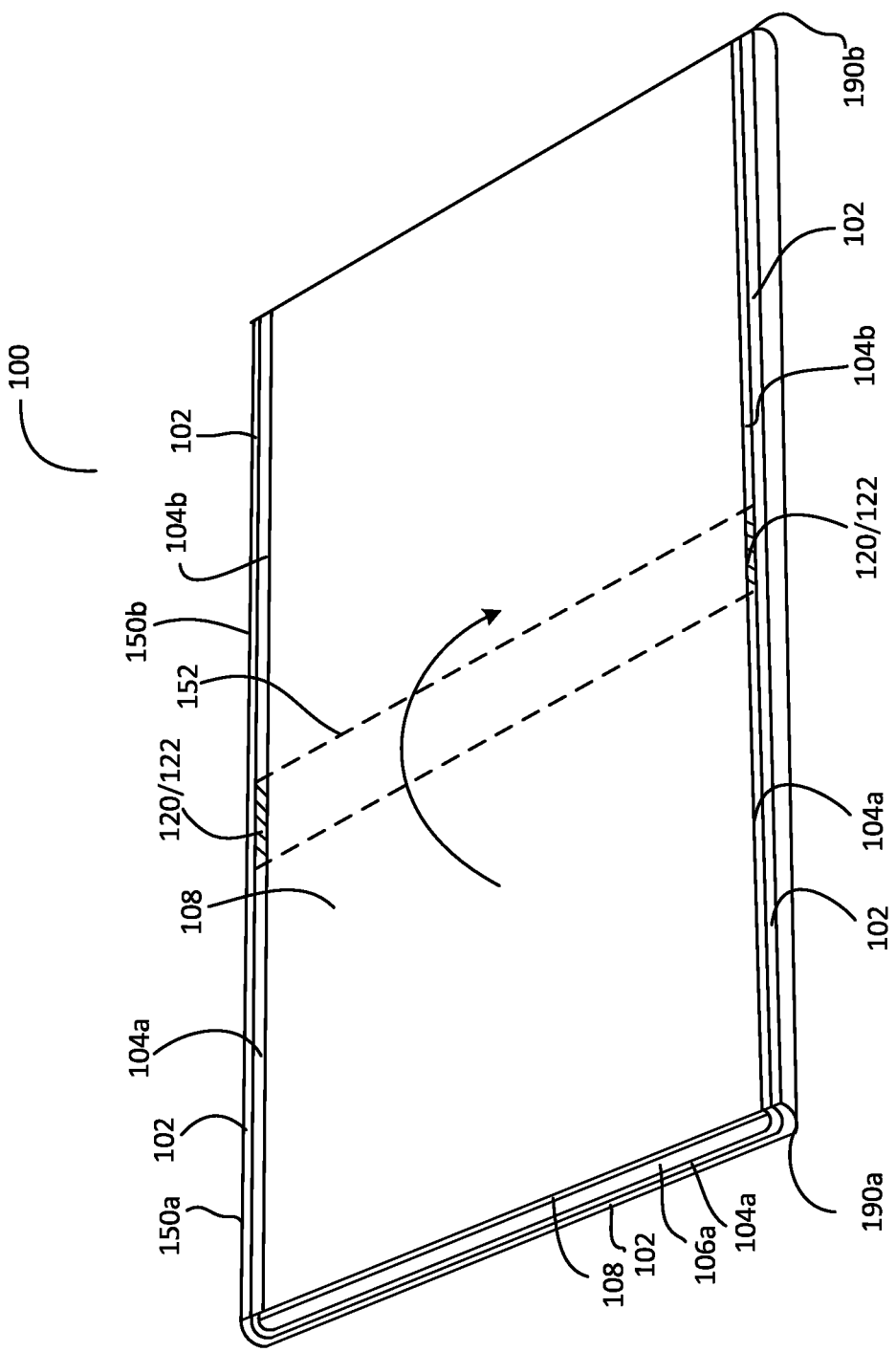
FIG. 6A illustrates an overhead frontside perspective view of a foldable information handling system according to one exemplary embodiment of the disclosed apparatus and methods.

FIG. 6A illustrates an overhead frontside perspective view of the exemplary embodiment of foldable information handling system 100 in the fully unfolded and open (or flat) position with the separate sections 150a and 150b unfolded in the direction of the arrow about 180 degrees from each other, e.g., such as when system 100 is used in a landscape tablet mode.

Figure 6B:
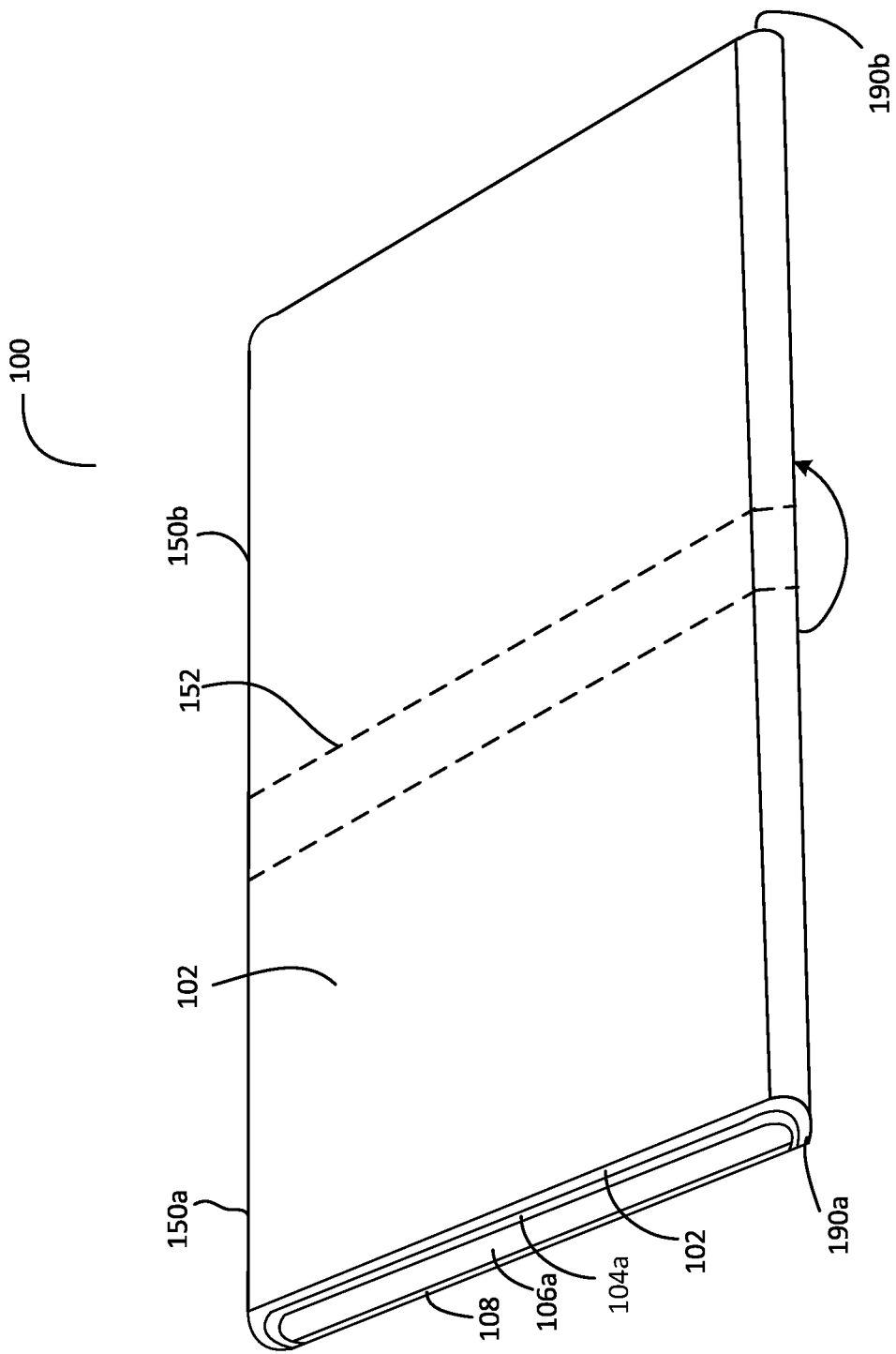
FIG. 6B illustrates an overhead backside perspective view of a foldable information handling system according to one exemplary embodiment of the disclosed apparatus and methods.

FIG. 6B illustrates an overhead backside perspective view of the exemplary embodiment of foldable information handling system 100 in the fully unfolded and open position of FIG. 6A with the separate sections 150a and 150b unfolded in the direction of the arrow about 180 degrees from each other.

Figure 7:
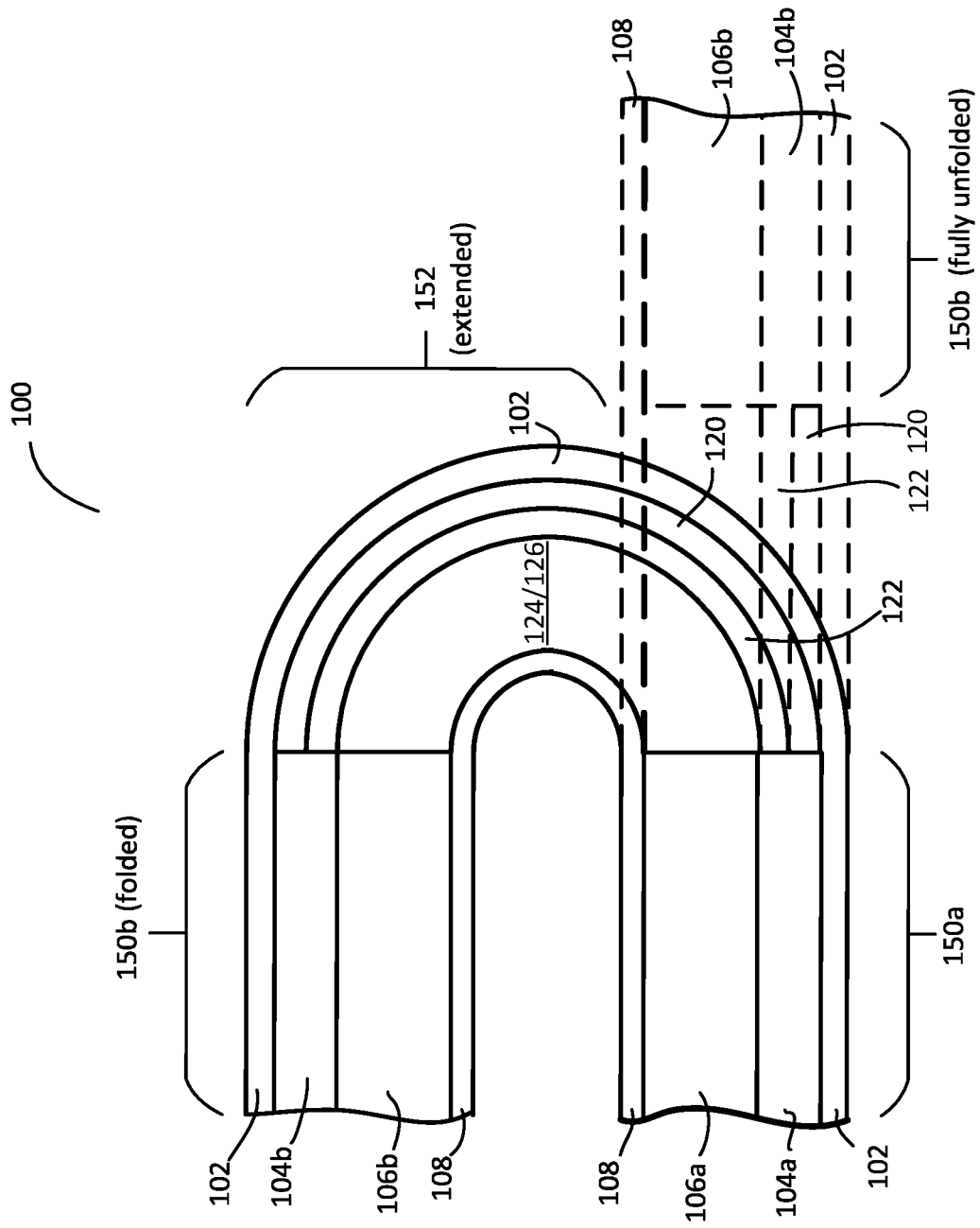
FIG. 7 illustrates a simplified partial side view of a foldable information handling system according to one exemplary embodiment of the disclosed apparatus and methods.

FIG. 7 illustrates a simplified partial side view of separate sections 150a and 150b of the exemplary embodiment of foldable information handling system 100. In FIG. 7 the hinge area 152 is denoted by cross hatching, and the second section 150b is shown with solid lines in folded closed position relative to the first section 150a. For comparison purposes, the second section 150b is also shown with dashed lines in unfolded open position relative to the first section 150a. Also shown in FIG. 7 is the location and state of gapless outer backside material 102, pleated elastic support material 120 and structural rods or wires 122 in each of the folded and unfolded positions of the second section 150*b* relative to the first section 150*a*.

As shown further in dashed outline in FIG. 7, gapless outer backside material 102, pleated elastic support material 120 and structural rods or wires 122 are contracted to a first relatively shorter linear length when second section 150*b* is disposed in fully unfolded and 180 degrees open position relative to the first section 150*a*. However, as shown in solid outline in FIG. 7, gapless outer backside material 102, pleated elastic support material 120 and structural rods or wires 122 are extended to a second relatively longer linear length when second section 150*b* is disposed in a folded 0 degrees closed position relative to the first section 150*a*. In one embodiment, the second relatively longer extended length of gapless outer backside material 102, pleated elastic support material 120 and structural rods or wires 122 is about 2.5 times longer than the first relatively shorter compressed linear length of these same components, although in other embodiments it is possible that the second relatively longer extended length of gapless outer backside material 102, pleated elastic support material 120 and structural rods or wires 122 may be greater or lesser than 2.5 times longer than the first relatively shorter compressed linear length of these same components. In each of the folded and unfolded positions, gapless outer backside material 102 forms a gapless backside outer surface across the foldable hinge area 152 of the information handling system 100 that expands in length (and remains gapless) as necessary to cover the entire backside surface of the hinge area 152 when the second section 150*b* is folded (partially or completely) relative to the first section 150*a*.

Figure 8A:
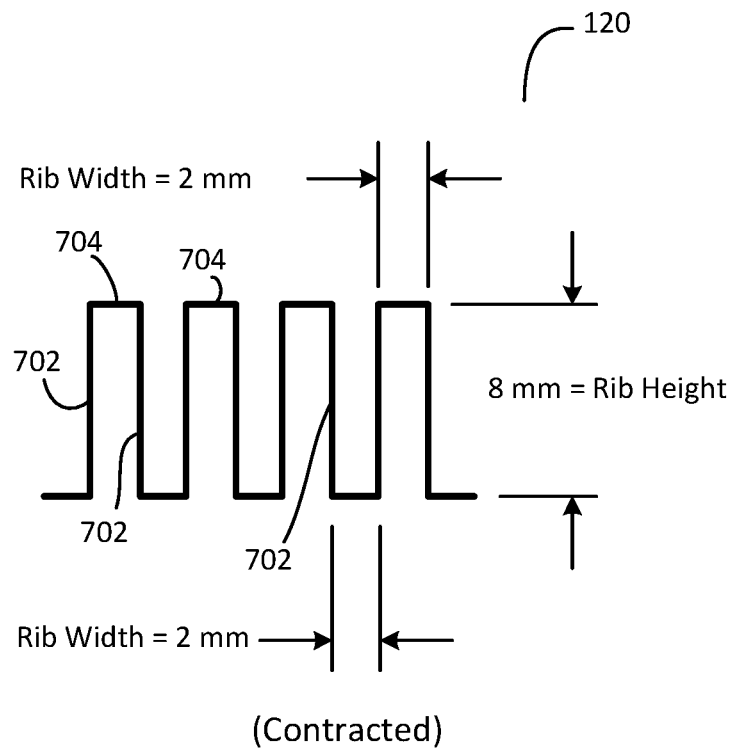
FIG. 8A illustrates a contracted partial section of pleated elastic support material according to one exemplary embodiment of the disclosed apparatus and methods.

FIG. 8A illustrates an exemplary embodiment of a contracted four-pleat section of pleated elastic support material 120 of a hinge area 152 of FIG. 7, showing example pleat height and pleat width dimensions as they may be configured in one embodiment. As shown in the embodiment of FIG. 8A, a ratio of vertical peak height 702 of each TPE pleat 704 to the width of each horizontal section of each TPE pleat 704 may be selected to be 4:1 to achieve a localized strain/stress value that is less than or equal to a defined maximum stretch (e.g., 30% elongation) for the dimensional change of the pleated elastic support material 120 that occurs within hinge area 152 when a foldable system 100 transitions from 180 degrees open state to 0 degrees closed state. In this regard, when viscoelastic materials such as polymers are subjected to stress they undergo deformations by molecular rearrangements and by viscoelastic flow, and this is called "creep". Any elongation above 30% at room temperature will typically cause permanent creep deformation in TPE materials, with the creep deformation occurring in the elastic region of the TPE material, not in the plastic domain of the TPE material. The addition of increased temperature will only accelerate the viscoelastic behavior.

Therefore, a pleated elastic support material 120 of a foldable system hinge area 152 may in one embodiment be dimensioned as shown in FIG. 8A in order to ensure that the change in dimension from the open state (180 degrees) to the closed state (0 degrees) will not induce an elongation of the pleated elastic support material 120 that is greater than a defined maximum percent stretch (e.g., 30% maximum stretch) so as not to yield the pleated elastic support material 120. For example, assuming a defined 30% maximum stretch for a selected type of pleated elastic support material 120 of FIG. 8A allows for up to 24 millimeters stretch from unfolded open position to folded closed position (e.g., from a first relatively shorter compressed linear length of 15 millimeters in 180 degree open state to a second relatively longer extended length that is 2.5 times longer, which is 37.5 millimeters or about 39 millimeters in 0 degree closed state). It will be understood that these values are exemplary only, and may vary according to the particular foldable system configuration and/or type of pleated elastic support material 120 employed.

It will also be understood that the TPE dimensions of FIG. 8A are exemplary only, and may alternatively be selected such that the ratio of vertical height of each TPE pleat to the width of each horizontal TPE pleat section is less than 4:1 or greater than 4:1.

Figure 8B:
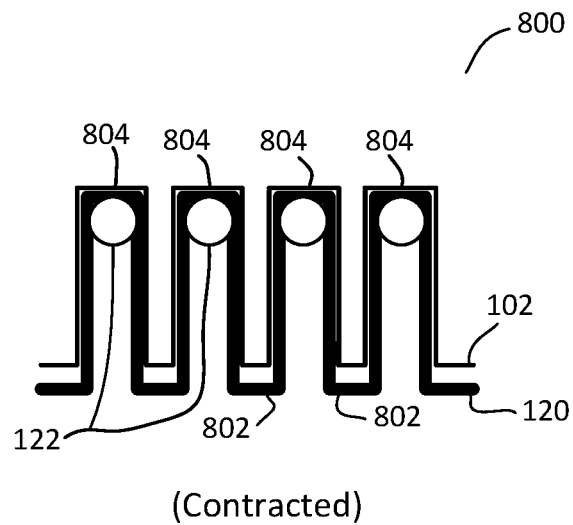
FIG. 8B illustrates a contracted partial section of a backside covering according to one exemplary embodiment of the disclosed apparatus and methods

FIG. 8B illustrates an exemplary embodiment of a contracted four-pleat partial section of backside covering 800 that includes a pleated elastic support material 120 overlain by gapless outer backside material 102, e.g., shown in contracted condition in FIG. 8B such as when the foldable information handling system 100 is unfolded into open (180 degree) position. As shown in FIG. 8B, gapless outer backside material 102 and pleated elastic support material 120 together form alternating peaks 804 and valleys 802, with the gapless outer backside material 102 only bonded (e.g., by adhesive such as epoxy) to the pleated elastic support material 120 at the top of the peaks 804, and not bonded to the pleated elastic support material 120 in the valley areas 802 of the gapless outer backside material 102. As shown, portion of the gapless outer backside material extend downward into valley areas 802 when backside covering 800 is in the contracted position. In the configuration of this embodiment, gapless outer backside material 102 has the ability to move in its areas between its attachment points to pleated elastic support material 120 at the top of the peaks 804. Using the configuration of this embodiment, when the system 100 is closed to the 0 degree position of FIG. 4, the gapless outer backside material 102 moves to visually take up (or bridge) any gaps between parts of the underlying pleated elastic support material 120 to provide a visually smooth-appearing outer backside cover as illustrated and described in relation to FIG. 9 herein.

As further shown in FIG. 8B, optional multiple parallel metal rods of wires 112 may each be attached to pleated elastic support material 120 at an individual peak 804, e.g., overmolded into the pleated elastic support material 120 at the top of the respective peaks 804 to contribute to the structure of the overall backside covering 800. The rods/wire 112 may be so positioned at the "peak" locations 804 to provide additional rigidity to prevent telegraphing of the hinge mechanism to the backside surface.

As shown in FIG. 8B, when the system 100 is in its unfolded 180 degree open position of FIG. 6A, the gapless outer backside material 102 contracts, the peaks 804 come together, and the valleys 802 fold downward to take up the "slack" of the excess backside covering material that is otherwise required for extra length when the system 100 is folded into the closed position as shown in FIG. 9. This prevents excess gapless outer backside material 102 of the backside covering material from "bulging" upwards or outwards from the system 100 when the system is unfolded into the 180 degree open position.

FIG. 9 illustrates the four-pleat partial section of backside covering 800 in an extended position, As shown in FIG. 9, when the system 100 is closed to the 0 degree position of FIG. 4, the gapless outer backside material 102 extends, the shape of peaks 804 flattens as they pull apart outwards with rods/wires 122, and the valleys 802 unfold upward as shown in FIG. 9. At the same time, portions of the gapless outer backside material 102 move out of the valleys 802 (and upwards in illustration of FIG. 9) to a position on top of the surface of the unfolded pleated elastic support material 120 as shown in FIG. 9. It will be understood that the depth of the valleys 802 may be selected based on the amount of elongation required for a given foldable system configuration. In this regard, the combination of the pleated elastic support material 120 and the available "excess" material in the valleys 802 acts to achieve the result of maintaining the total strain/stress on the pleated elastic support material 120 at or below 30%. It will also be understood that the thickness and modulus of the TPE may be adjusted to achieve a selected elongation target with the known force.

Figure 10:
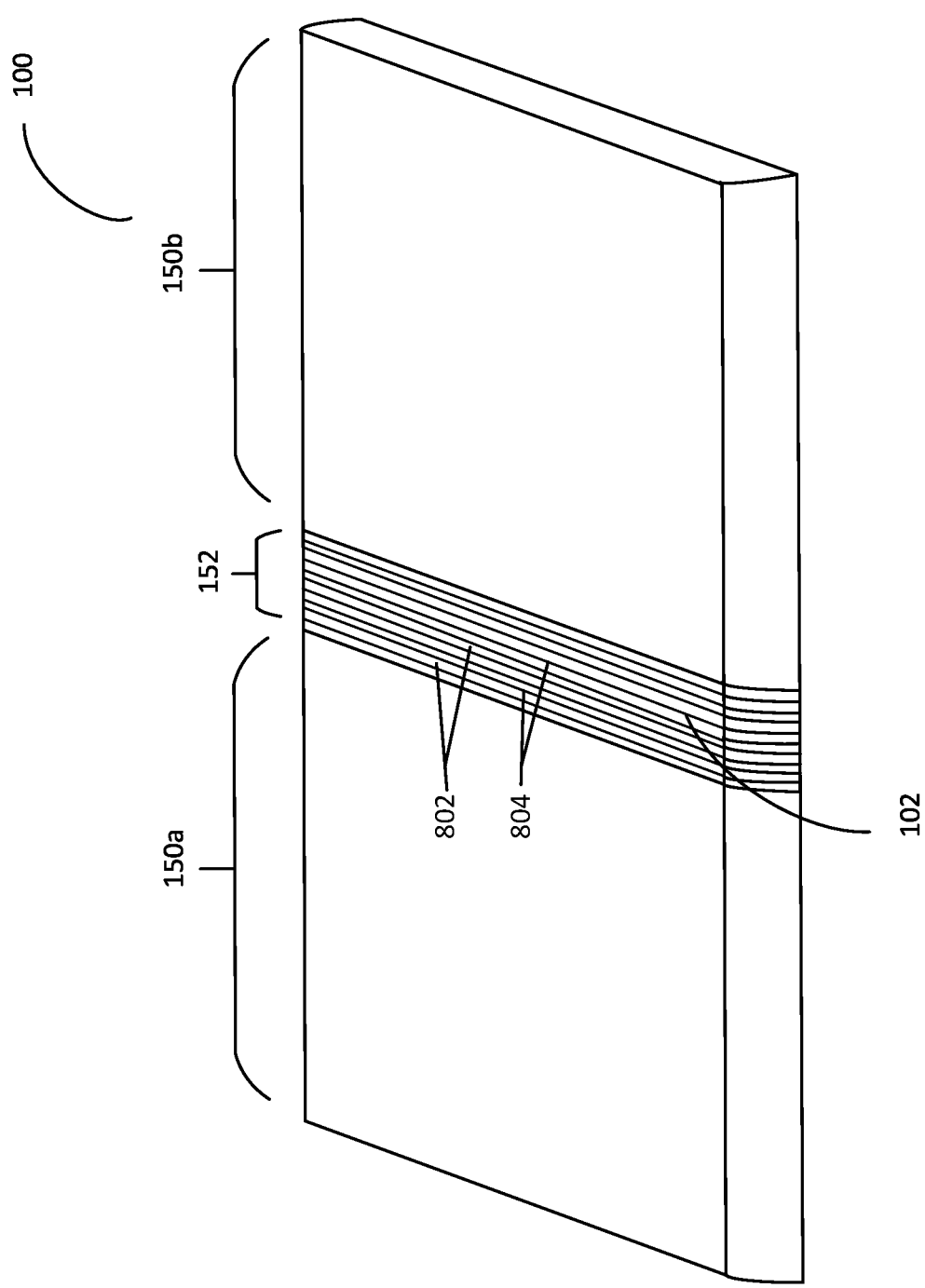
FIG. 10 illustrates a backside perspective view of an unfolded foldable information handling system according to one exemplary embodiment of the disclosed apparatus and methods.
Figure 11:
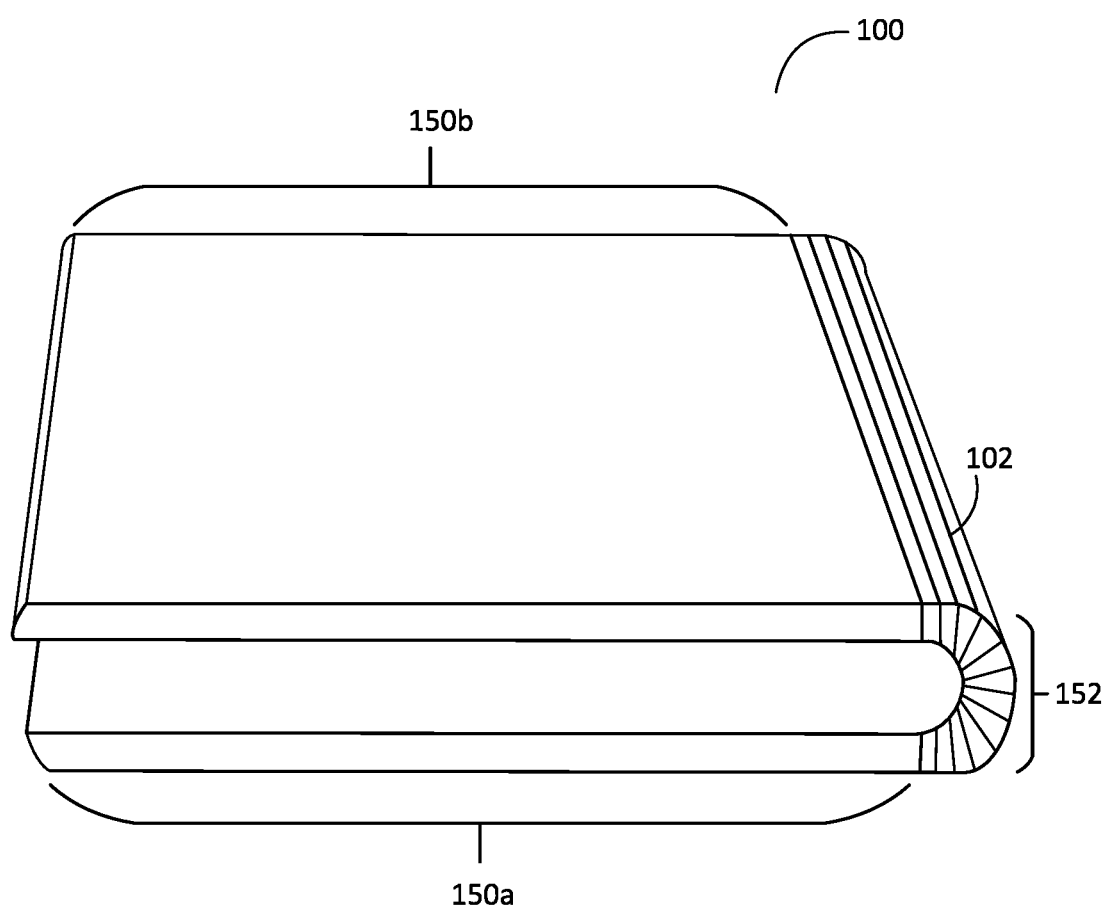
FIG. 11 illustrates a backside perspective view of a folded foldable information handling system according to one exemplary embodiment of the disclosed apparatus and methods.

FIG. 10 illustrates a backside perspective view of one exemplary embodiment of a foldable information handling system 100 with a gapless flexible backside covering shown with system 100 in its unfolded 180 degree open position. FIG. 10 shows the contracted pleats of gapless outer backside material 102 that are present in hinge area 152 in the unfolded open position of system 100. As shown, the longitudinal axis of the peaks 804 and valleys 802 of the pleats of pleated elastic support material 120 is disposed and oriented parallel to a longitudinal axis of the hinge 126 of system 100 shown in FIG. 2. FIG. 11 illustrates a backside perspective view of the foldable information handling system 100 of FIG. 10 with the gapless flexible backside covering shown with system 100 in its folded 0 degree closed position. FIG. 11 also shows the expanded portions of gapless outer backside material 102 that are present over the extended underlying pleats of pleated elastic support material 120 within hinge area 152 in the folded closed position of system 100. In one embodiment, the backside of the expanded pleats of gapless outer backside material 102 may present a smooth outer backside surface, e.g., as shown in FIGS. 4 and 9.

Figure 12:
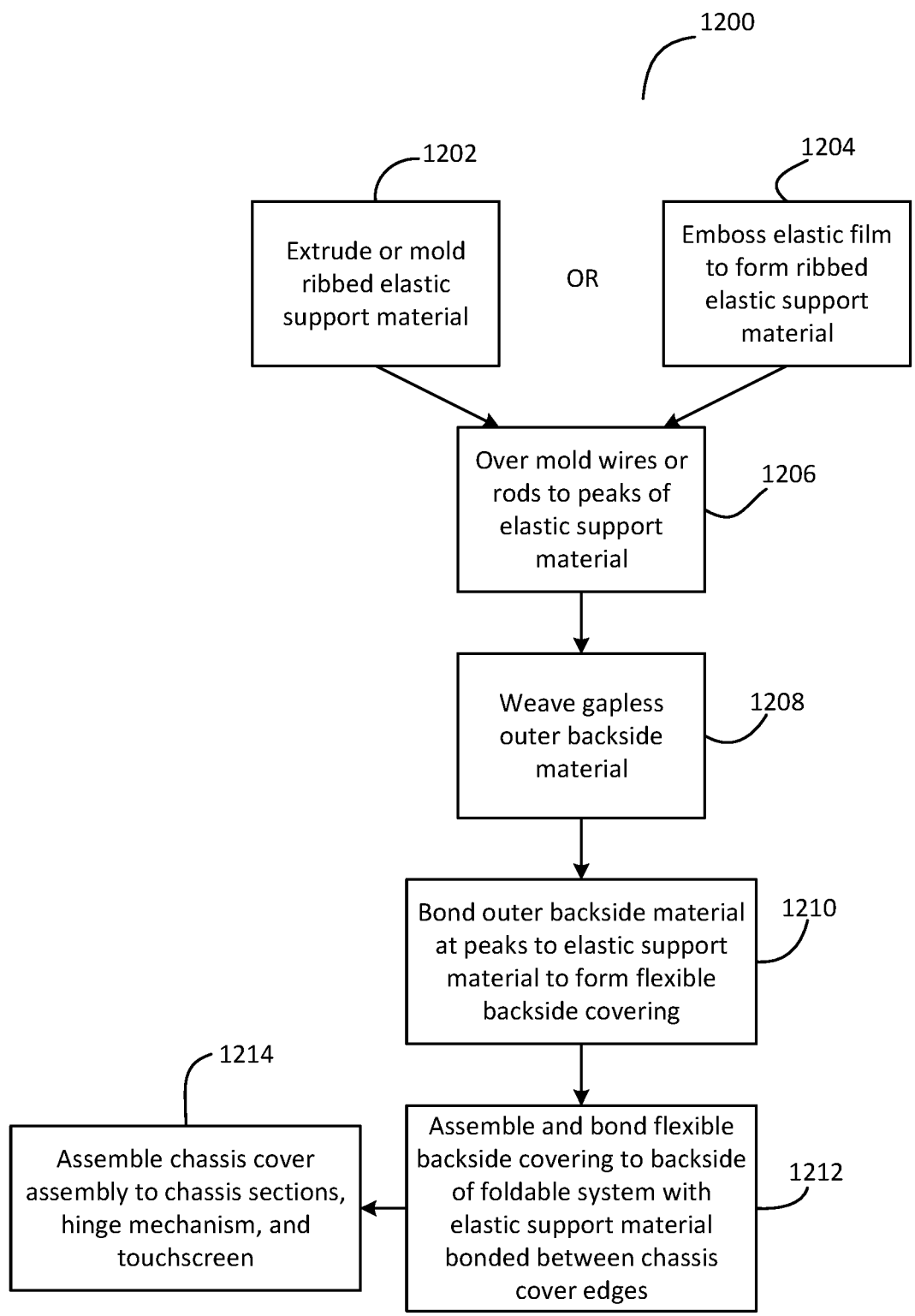
FIG. 12 illustrates methodology according one exemplary embodiment of the disclosed apparatus and methods.

FIG. 12 illustrates one exemplary embodiment of a methodology 1200 that may be implemented to produce a gapless flexible backside covering and assemble it to other components of a foldable information handling system 100. Methodology 1200 starts in either of step 1202 or 1204 where a pleated elastic support material 120 (e.g., of TPE such as TPU) is formed. For example, pleated elastic support material 120 may be molded from a source of elastic material in step 1202, or a flat sheet of elastic material may be embossed with pleats in alternative step 1204. Next, in step 1206, multiple parallel rods or wires 122 (e.g., metal such as aluminum or steel, plastic, fiberglass, etc.) may be overmolded to each of the respective peaks of the pleated elastic support material 120.

In a separate step 1208, gapless outer backside material 102 (e.g., fabric such as elastic polyurethane material like "elastane" or Spandex which has elastic properties) may be weaved from suitable components, and cut to selected dimensions, e.g., to have dimensions sufficient to cover at least the hinge area 152 of a particular foldable system 100 and in one embodiment to cover at least a portion of the backside of each of first and second chassis covers 104a and 104b. As shown in FIG. 1, gapless outer backside material 102 may in one exemplary embodiment be cut with dimensions sufficient to cover the entire backside surfaces of first and second chassis covers 104a and 104b, although a gapless outer backside material 102 may alternatively be cut with dimensions sufficient to cover at least a portion of the backside surfaces of each of first and second chassis covers 104a and 104b.

In step 1210, the gapless outer backside material 102 is bonded to the peaks 704 of pleated elastic support material to form a flexible backside covering for the foldable information handling system 100.

Next, in step 1212, the components of flexible backside covering of step 1212 are bonded (e.g., with adhesive such as epoxy) to the backside of foldable system 100, with the pleated elastic support material 120 (together with optional attached wires/rods 122) bonded (e.g., with adhesive such as epoxy) to and between the inner edges of first and second chassis covers 104a and 104b to form a chassis cover assembly of these components, as shown in FIG. 1.

Finally, in step 1214 the chassis cover assembly components of step 1212 are assembled to the other components of foldable information handling system 100, e.g., including first and second chassis sections 106a and 106b, hinge cover 124, hinge mechanism 126, and continuous foldable touchscreen 108 as shown in FIG. 1.

It will be understood that the steps of methodology 1200 of FIG. 12 are exemplary only, and that any other order of steps and/or combination of additional, fewer, and/or alternative steps may be employed that is suitable for producing a gapless flexible backside covering and assembling it to other components of a foldable information handling system.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. An information handling system, comprising:
   a first section and a second section coupled together at their edges by a hinge, an open space being defined over a backside hinge area defined between a backside of the first section and a backside of the second section;
a pleated first material disposed across the open space to extend between the backside of the first section and the backside of the second section, the pleated first material comprising multiple individual pleats; and
at least one display screen coupled to at least one of a frontside of the first section or a frontside of the second section;
where the open space over the backside hinge area expands and individual pleats of the pleated first material extend apart from each other to fill the expanded open space over the backside hinge area when the first section and second section are folded together in a closed position; and
where the open space over the backside hinge area contracts and the individual pleats of the pleated first material contract together to fill the contracted open space over the backside hinge area when the first section and second section are unfolded apart from each other to an open position.

2. The information handling system of claim 1, where the pleats of the pleated first material comprise alternating peaks and valleys; and where the information handling system further comprises a gapless second material disposed over the pleated first material and extending between the first section and the second section, the gapless second material being supported by the peaks of the pleated first material.

3. The information handling system of claim 2, where the pleated first material comprises a thermoplastic elastomer; and where the gapless second material comprises an elastic fabric.

4. The information handling system of claim 2, where the gapless second material folds in between adjacent contracted-together peaks of the pleated first material when the first section and second section are unfolded apart from each other to an open position of the information handling system; and where the gapless second material unfolds and flattens out over the extended-apart peaks of the pleated first material when the first section and second section are folded together in a closed position of the information handling system.

5. The information handling system of claim 2, where each of the peaks of the pleated first material are bonded to the gapless second material and where each of the valleys of the pleated material are not bonded to the gapless second material.

6. The information handling system of claim 1, where the a longitudinal axis of each of the pleats of the pleated first material is disposed parallel to a longitudinal axis of the hinge of the information handling system.

7. The information handling system of claim 1, where the pleats of the pleated first material comprise alternating peaks and valleys; where the information handling system further comprises multiple parallel rods or wires oriented parallel to a longitudinal axis of the individual pleats; and where each of the rods or wires is attached to the pleated first material at a different respective peak of the pleated first material.

8. The information handling system of claim 1, further comprising at least one display screen disposed on the frontside of at least one of the first section and the second section.

9. The information handling system of claim 1, where the at least one display screen is a foldable touchscreen display that extends continuously across a frontside hinge area defined between a frontside of the first section and a frontside of the second section.

10. The information handling system of claim 1, where the first section comprises a first chassis of the information handling system and the second section comprises a second chassis of the information handling system.

11. A method, comprising:
rotating a first section of an information handling system relative to a second section of an information handling system about a hinge;
where an open space is defined over a backside hinge area defined between a backside of the first section and a backside of the second section;
where a pleated first material is disposed across the open space to extend between the backside of the first section and the backside of the second section, the pleated first material comprising multiple individual pleats;
where at least one display screen is coupled to at least one of a frontside of the first section or a frontside of the second section; and
where rotating the first section of the information handling system relative to the second section of the information handling system further comprises:
folding the first section and second section together into a closed position to cause the open space over the backside hinge area to expand and the individual pleats of the pleated first material to extend apart from each other to fill the expanded open space over the backside hinge area, and
unfolding the first section and the section apart from each other into an open position to cause the open space over the backside hinge area to contract and the individual pleats of the pleated first material to contract together to fill the contracted open space over the backside hinge area.

12. The method of claim 11, where the pleats of the pleated first material comprise alternating peaks and valleys; where the information handling system further comprises a gapless second material disposed over the pleated first material and extending between the first section and the second section, the gapless second material being supported by the peaks of the pleated first material; and where the method further comprises:
folding the first section and second section together into a closed position to cause the gapless second material to unfold and flatten out over the extended-apart peaks of the pleated first material, and
unfolding the first section and second section apart from each other into an open position to cause the gapless second material to fold in between adjacent contracted-together peaks of the pleated first material.

13. The method of claim 12, where the pleated first material comprises a thermoplastic elastomer; and where the gapless second material comprises an elastic fabric.

14. The method of claim 11, where the at least one display screen is a foldable touchscreen display that extends continuously across a frontside hinge area defined between a frontside of the first section and a frontside of the second section.

15. A method, comprising:
forming a pleated first material comprising multiple individual pleats; and
assembling the pleated first material to a first section and a second section of an information handling system, the first and second sections being coupled together at their edges by a hinge with an open space being defined over a backside hinge area defined between a backside of the first section and a backside of the second section, and the pleated first material being assembled across the open space to extend between the backside of the first section and the backside of the second section.

16. The method of claim 15, further comprising bonding individual peaks of the pleated first material to a gapless second material to form a flexible backside covering prior to assembling the pleated first material to the first section and the second section as part of the flexible backside covering of the information handling system; and where portions of the gapless second material.

17. The method of claim 16, where the pleated first material comprises a thermoplastic elastomer; and where the gapless second material comprises an elastic fabric.

18. The method of claim 16, where the first section comprises a first chassis of the information handling system and the second chassis comprises a second chassis of the information handling system; where assembling the pleated first material to the first section and the second section as part of the flexible backside covering of the information handling system comprises bonding the gapless second material to a backside of each of the first chassis and the second chassis, and bonding the pleated first material to and between inner edges of covers of the first and second chassis; and where the method further comprises assembling a display screen to a frontside of at least one of the first chassis or second chassis.

19. The method of claim 18, where the at least one display screen is a foldable touchscreen display; and where assembling the display screen to the frontside of at least one of the first chassis or second chassis comprises assembling the foldable touch screen display to extend continuously across a frontside hinge area defined between the frontside of the first section and the frontside of the second section.

20. The method of claim 15, further comprising assembling multiple parallel rods or wires to each of respective peaks of the pleated first material prior to assembling the pleated first material to the first section and the second section of the information handling system.

* * * * *